(12) United States Patent
Kleindienst et al.

(10) Patent No.: US 12,456,644 B2
(45) Date of Patent: Oct. 28, 2025

(54) APPARATUS FOR PROCESSING A WAFER, AND METHOD OF CONTROLLING SUCH AN APPARATUS

(71) Applicant: LAM RESEARCH AG, Villach (AT)

(72) Inventors: Martin Kleindienst, Villach (AT); Stefan Koch, Villach (AT)

(73) Assignee: LAM RESEARCH AG, Villach (AT)

( * ) Notice: Subject to any disclaimer, the term of this patent is extended or adjusted under 35 U.S.C. 154(b) by 896 days.

(21) Appl. No.: 17/426,791

(22) PCT Filed: Jan. 29, 2020

(86) PCT No.: PCT/EP2020/052139
§ 371 (c)(1),
(2) Date: Jul. 29, 2021

(87) PCT Pub. No.: WO2020/160976
PCT Pub. Date: Aug. 13, 2020

(65) Prior Publication Data
US 2022/0352005 A1 Nov. 3, 2022

(30) Foreign Application Priority Data
Feb. 6, 2019 (GB) ..................................... 1901637

(51) Int. Cl.
*H01L 21/687* (2006.01)
*H01L 21/67* (2006.01)
(52) U.S. Cl.
CPC .. *H01L 21/68764* (2013.01); *H01L 21/67023* (2013.01); *H01L 21/67098* (2013.01); *H01L 21/6715* (2013.01); *H01L 21/67248* (2013.01)

(58) Field of Classification Search
CPC ......... H01L 21/68764; H01L 21/67023; H01L 21/67098; H01L 21/6715; H01L 21/67248; H01L 21/67051; H01L 21/67115; H01L 21/6708; B08B 3/02
See application file for complete search history.

(56) References Cited

U.S. PATENT DOCUMENTS 10,497,581 B2 * 12/2019 Hashizume ....... H01L 21/67109
11,072,094 B2   7/2021 Cochran et al.
(Continued)

FOREIGN PATENT DOCUMENTS

JP   H0499046 A    3/1992
JP   2015179751 A  10/2015
(Continued)

OTHER PUBLICATIONS

International Search Report and Written Opinion of the ISA issued in PCT/EP2020/052139, mailed Apr. 21, 2020; ISA/EP.
(Continued)

*Primary Examiner* — Erin F Bergner

(57) ABSTRACT

An apparatus for processing a wafer comprises: a rotatable chuck adapted to receive a wafer; a heating assembly comprising an array of heating elements arranged to heat a wafer received by the rotatable chuck; an image sensor arranged to detect electromagnetic radiation from a surface of the wafer; and a controller configured to control supply of power to the array of heating elements based on a measurement output of the image sensor.

21 Claims, 5 Drawing Sheets

(56) References Cited

U.S. PATENT DOCUMENTS

| | | | |
|---|---|---|---|
| 2008/0274670 A1* | 11/2008 | Tada | B24B 49/12 |
| | | | 451/6 |
| 2010/0054720 A1 | 3/2010 | Hunter et al. | |
| 2011/0291022 A1 | 12/2011 | Lee et al. | |
| 2012/0160274 A1* | 6/2012 | Kasai | H01L 21/02052 |
| | | | 134/94.1 |
| 2014/0199785 A1 | 7/2014 | Ranish et al. | |
| 2015/0219499 A1 | 8/2015 | Waldmann et al. | |
| 2017/0345681 A1 | 11/2017 | Mui et al. | |
| 2018/0053666 A1 | 2/2018 | Babayan et al. | |
| 2018/0156665 A1 | 6/2018 | Jung et al. | |
| 2018/0337069 A1 | 11/2018 | Staudegger et al. | |
| 2019/0148134 A1* | 5/2019 | Emoto | H01L 21/67028 |
| | | | 427/372.2 |
| 2020/0035517 A1* | 1/2020 | Hidaka | H01L 21/0206 |
| 2021/0202280 A1* | 7/2021 | Kim | B23K 26/064 |
| 2021/0257210 A1* | 8/2021 | Tokunaga | H01L 21/67248 |
| 2021/0391188 A1* | 12/2021 | Inoue | H01L 21/306 |
| 2024/0035166 A1* | 2/2024 | Lee | H01L 21/67115 |

FOREIGN PATENT DOCUMENTS

| | | |
|---|---|---|
| JP | 2017069354 A | 4/2017 |
| KR | 20080057998 A | 6/2008 |
| KR | 20130137187 A | 12/2013 |
| KR | 101459668 B1 | 11/2014 |
| KR | 20160046364 A | 4/2016 |
| KR | 101739788 B1 | 5/2017 |
| KR | 102254047 B1 | 5/2021 |

OTHER PUBLICATIONS

GB Search Report of the Intellectual Property Office issued in Application No. GB1901637.7, dated Jun. 14, 2019.
Office Action in Corresponding Japanese patent application No. 2021-544732 dated Feb. 14, 2024.
Examination Report in correponding European pattent application No. 20703404.2-1211, dated May 16, 2023.
Office Action in Corresponding Korean patent application No. 10-2021-7028254 mailed Jul. 24, 2024.

\* cited by examiner

APPARATUS FOR PROCESSING A WAFER, AND METHOD OF CONTROLLING SUCH AN APPARATUS

CROSS-REFERENCE TO RELATED APPLICATIONS

This application is a U.S. National Phase Application under 35 U.S.C. 371 of International Application No. PCT/EP2020/052139, filed on Jan. 29, 2020, which claims the benefit of Great Britain Patent Application No. GB 1901637.7, filed on Feb. 6, 2019. The entire disclosures of the applications referenced above are incorporated herein by reference.

FIELD OF THE INVENTION

The present invention relates to an apparatus for processing a wafer, and to a method of controlling such an apparatus.

BACKGROUND TO THE INVENTION

Semiconductor wafers may be subjected to various surface treatment processes, such as etching, cleaning, polishing and material deposition. To perform such processes, a wafer may be mounted on a rotatable chuck, so that various processes can be performed on a surface of the wafer.

For example, the surface of the wafer may be cleaned by applying a cleaning liquid or rinse liquid (e.g. isopropyl alcohol or de-ionised water) to the surface of the wafer. The surface of the wafer may then be dried by spinning the wafer using the rotatable chuck and heating the wafer to cause evaporation of the cleaning liquid or rinse liquid. Such a cleaning process is commonly referred to as a spin-clean process.

An example of an apparatus which may be used for cleaning the surface of a wafer is described in US2017/0345681A1, the contents of which are incorporated herein by reference.

The apparatus described in in US2017/0345681A1 includes a rotatable chuck on which a wafer is mountable, and a liquid dispenser for dispensing liquid on an upper surface of the wafer when the wafer is mounted on the rotatable chuck. The apparatus also includes an array of heating elements disposed below the wafer when the wafer is mounted in the rotatable chuck, and arranged to heat the wafer. After liquid is dispensed on the surface of the wafer, the array of heating elements are controlled to heat the wafer to cause evaporation of the liquid.

SUMMARY OF THE INVENTION

At its most general, the present invention provides an apparatus for processing a wafer, comprising heating elements arranged to heat a wafer mounted in the apparatus, and an image sensor arranged to detect electromagnetic radiation from a surface of the wafer, wherein supply of power to the heating elements is controlled based on a measurement output of the image sensor.

Processes performed on wafers can be highly sensitive to processing conditions such as temperature. The present invention allows for more accurate control of the temperature of a wafer during processing, because the heating elements used to heat the wafer are controlled based on the measurement output of an image sensor that detects electromagnetic radiation from a surface of the wafer.

For example, the measurement output of the image sensor may indicate a current temperature distribution across some or all of the wafer, and the power supplied to the heating elements may then be controlled based on the measurement output to achieve a desired temperature distribution across some or all of the wafer.

A conventional technique for attempting to achieve a desired temperature distribution across a wafer during processing of the wafer is to manually set the power supplied to each of the heating elements based on the desired temperature distribution. However, this is a long and cumbersome procedure. Furthermore, this technique is not robust with respect to disturbances in the temperature distribution. For example, the heating caused by the heating elements may change over time, e.g. due to a fault or degradation of one or more of the heating elements. This may lead to incorrect heating conditions being applied to the wafer, and/or to variations in heating conditions between different processing steps and/or from wafer to wafer. Other environmental factors that are difficult or impossible to properly account for in advance may also affect the temperature distribution across the wafer. For example, where a liquid is present on a surface of the wafer, the properties or characteristics of the liquid may vary across the surface of the wafer, and consequently affect the temperature distribution across the surface of the wafer.

The apparatus of the present invention may serve to address this problem, because the heating elements used to heat the wafer are controlled based on the measurement output of an image sensor that detects electromagnetic radiation from a surface of the wafer. For example, discrepancies between an actual temperature distribution of the wafer and a target temperature distribution of the wafer may be identified based on the measurement output of the image sensor, and the power supplied to the heating elements controlled to remove or reduce any such discrepancies so as to achieve or substantially achieve the target temperature distribution.

Accordingly, according to a first aspect of the present invention there is provided an apparatus for processing a wafer, the apparatus comprising: a rotatable chuck adapted to receive a wafer; a heating assembly comprising an array of heating elements arranged to heat a wafer received by the rotatable chuck; an image sensor arranged to detect electromagnetic radiation from a surface of the wafer; and a controller configured to control supply of power to the array of heating elements based on a measurement output of the image sensor.

As explained above, the image sensor is arranged to detect electromagnetic radiation from the surface of the wafer. The power supplied to the heating elements is then controlled based on the measurement output of the image sensor. Information indicative of a current temperature distribution of the wafer may therefore be measured in situ, for example in real-time, and used to control the heating elements so as to change the temperature distribution of the wafer, for example in real time.

Therefore, with the present invention it may be possible to more accurately control a temperature distribution of the wafer during processing of the wafer.

The apparatus according to the first aspect of the present invention may have any one, or, where compatible, any combination of the following optional features.

In practice, the electromagnetic radiation detected by the image sensor is representative of, or indicative of, the temperature of the surface of the wafer. For example, an intensity of the electromagnetic radiation may depend on the temperature of the surface of the wafer. For example, there may be a fixed mathematical relationship between the intensity of the electromagnetic radiation and the temperature of the surface of the wafer.

The term "rotatable chuck" (or rotary chuck) may merely mean a wafer holder that is designed to hold a wafer and rotate the wafer.

The rotatable chuck may be configured to rotate the wafer relative to an axis of rotation of the rotatable chuck that is substantially perpendicular to a surface of the wafer.

The rotatable chuck may be substantially circular when viewed from above.

The rotatable chuck may include a mechanism adapted to receive the wafer and hold the wafer securely in place relative to the chuck (e.g. a clamp, screw, vacuum holder, etc.).

The rotatable chuck may be adapted to receive a wafer of a predetermined size, e.g. a wafer having a diameter of 300 mm or 450 mm.

The rotatable chuck may include a motor for driving rotation of the chuck relative to the axis of rotation.

Alternatively, the rotatable chuck may be caused to rotate by an external driving means, for example via magnetic induction.

The heating assembly serves to heat a wafer mounted on the rotatable chuck. The heating assembly comprises an array of heating elements arranged to heat a wafer received by the rotatable chuck.

The term "array" may merely mean a plurality of heating elements, and does not necessarily mean that the heating elements are arranged in any particular order.

The array of heating elements may be arranged to face towards the wafer when the wafer is received by the rotatable chuck.

The array of heating elements may be arranged to face towards a first surface of the wafer, which is opposite a second surface of the wafer on which processing (e.g. cleaning, deposition of material, etc.) is performed.

The heating elements may be disposed on a substantially plane surface (e.g. on a board, such as a circuit board).

The board may be arranged to be substantially parallel to the wafer when the wafer is received by the rotatable chuck.

The heating elements may be substantially uniformly distributed over the plane surface, to heat the wafer in a uniform manner.

The heating assembly may have a circular shape when viewed from above.

The array of heating elements may be arranged to cover an area that is substantially the same as an area of the wafer, or an area that is within 10% of an area of the wafer.

All of the heating elements may be of the same type (e.g. they may all have the same characteristics).

The heating assembly may be mounted relative to the rotatable chuck such that it does not rotate together with the rotatable chuck when the rotatable chuck is rotated about the axis of rotation. In other words, the array of heating elements may remain stationary when the rotatable chuck is rotated about the axis of rotation. This may facilitate providing electrical connections to the array of heating elements.

The heating elements may be arranged in the heating assembly on concentric circles (concentric about a centre of the heating assembly).

In each concentric circle the heating elements may be bunched into different groups. In other words, the heating elements in a respective concentric circle may not be evenly distributed around that concentric circle.

Each of the different groups may contain the same number of heating elements, for example 16 heating elements.

In some embodiments, it may be possible to control individual groups of heating elements in the array separately.

Similarly, in some embodiments it may be possible to control each individual heating element separately.

In general, a heating element is an element (or part) that is operable to heat a wafer received by the rotatable chuck.

Any type of heating element may be used, for example radiative, conductive or convective.

In some embodiments of the present invention the heating elements may be light-emitting heating elements arranged to illuminate the wafer to heat the wafer.

In general, a light-emitting heating element is an element (or part) that performs radiative heating using light.

The light emitted by the light-emitting heating element may be visible light.

Herein, a light-emitting heating element may refer to a light source which emits light at a wavelength suitable for heating a wafer. For example, a light-emitting heating element may emit light having a maximum intensity in a wavelength range from 380 nm to 650 nm.

In some embodiments, one or more of the light-emitting heating elements may be light emitting diodes (LEDs).

Use of LEDs may be advantageous, as LEDs may be highly efficient and may generate relatively little wasted heat. The LEDs emit light at a wavelength or in a range of wavelengths that is suitable for heating a wafer. For example, the LEDS may emit light with a wavelength or wavelengths in the range of 380 nm to 650 nm. Other wavelength ranges may also be suitable.

The image sensor is arranged to detect electromagnetic radiation from a surface of the wafer.

As mentioned above, in practice the electromagnetic radiation detected by the image sensor is electromagnetic radiation that is indicative of (for example correlates with, or is proportional to) the temperature of the wafer.

The term image sensor may merely mean a two-dimensional array of sensors or sensing elements for measuring an intensity distribution of the electromagnetic radiation over two-dimensions.

The image sensor may output an image of the two-dimensional intensity distribution of the electromagnetic radiation, or information indicative of such a two-dimensional intensity distribution, for example a stream of data.

The electromagnetic radiation may be emitted by the wafer itself, or by one or more substances on the surface of the wafer. For example, the electromagnetic radiation may be emitted by a liquid on a surface of the wafer. References herein to emission of electromagnetic radiation by the surface of the wafer explicitly include emission of electromagnetic radiation by other substances on the surface of the wafer, such as a liquid on the surface of the wafer.

The controller is configured to control supply of power to the array of heating elements based on a measurement output of the image sensor.

The controller may be a computing device having software installed thereon for controlling the power supplied to the array of heating elements and receiving a measurement output of the image sensor.

The controller may be connected, via a communication interface (e.g. USB, Ethernet, etc.), to a power supply which supplies power to the array of heating elements. The controller may be configured to send commands to the power supply, to control the amount of power supplied by the power supply to the array of heating elements. Similarly, the controller may be connected, via a communication interface (e.g. USB, Ethernet, etc.), to the image sensor to receive the measurement output from the image sensor.

For example, the controller may be configured to control the power supplied to the array of heating elements based on the measurement output of the image sensor until the measurement output indicates that a desired temperature distribution across some or all of the wafer has been achieved or substantially achieved.

The controller may be configured to compare a measurement output of the image sensor, or information derived from the measurement output, to a reference and, based on the comparison, adjust the power supplied to one or more of the heating elements of the array of light-emitting heating elements.

The reference may relate to a desired temperature distribution. For example, the reference may correspond to a measurement output predicted or previously measured for a wafer having the desired temperature distribution, or to a target measurement output.

The controller may be configured to store, in a memory, the reference.

The image sensor may be a thermographic image sensor, an infrared image sensor or a thermal imaging image sensor, for example.

The image sensor may be configured to detect infrared radiation.

The image sensor may be a camera. For example, the camera may produce an image of the electromagnetic radiation detected by the image sensor.

The camera may be a thermographic camera, an infrared camera or a thermal imaging camera, for example.

The image sensor may be adapted to detect electromagnetic radiation having a wavelength in the range of 3 to 14 µm. This wavelength range corresponds to so-called medium wavelength infrared and long wavelength infrared, which are indicative of temperature.

The image sensor may be adapted to detect electromagnetic radiation having a wavelength in the range of 3 to 5 µm. This wavelength range corresponds to so-called medium wavelength infrared.

The image sensor may be adapted to detect electromagnetic radiation having a wavelength in the range of 8 to 14 µm. This wavelength range corresponds to so-called medium wavelength infrared.

Such types of electromagnetic radiation may provide accurate information regarding (or indicative of) the temperature of the wafer, and the measurement output of the image sensor may therefore be used for accurately controlling the temperature of the wafer.

The image sensor may be adapted to detect electromagnetic radiation having a wavelength in a range where the transmissivity of isopropyl alcohol (IPA) is below 80%. Where IPA is present on the surface of the wafer, this provides an advantage that some, a majority, or all electromagnetic radiation coming from below the IPA may be shielded by the IPA and therefore not detected by the image sensor. For example, the image sensor may be adapted to selectively detect a range of wavelengths including a wavelength in a range where the transmissivity of isopropyl alcohol (IPA) is below 80%. Alternatively, as discussed below, a filter that selectively transmits electromagnetic radiation having a wavelength in a range where the transmissivity of isopropyl alcohol (IPA) is below 80% may be provided.

The image sensor may be configured to detect electromagnetic radiation having a wavelength corresponding to a peak in an emission intensity spectrum of isopropyl alcohol (IPA), or corresponding to a minimum (local or absolute minimum) of a transmission spectrum for isopropyl alcohol (IPA).

The apparatus may comprise a liquid dispenser for dispensing a liquid on to the surface of the wafer.

For example, the liquid dispenser may be used to dispense isopropyl alcohol or de-ionised water to the surface of the wafer in order to clean or rinse the surface of the wafer.

The liquid dispenser may be arranged to dispense liquid on a surface of the wafer that is opposite a surface of the wafer that faces the array of heating elements.

The liquid dispenser may be movable to dispense liquid at different positions on the surface of the wafer. Thus, during a cleaning process, liquid may be dispensed on the surface of a wafer received in the rotatable chuck.

The liquid dispenser may comprise an arm having a dispensing nozzle.

The arm may be pivoted for rotation at one end, so that the dispensing nozzle can be moved in an arc across the surface of the wafer by rotating the arm about the pivot.

The dispensing nozzle may be movable between a first position at a centre of rotation of the wafer and a second position outside of the circumference of the wafer. The dispensing nozzle may therefore be movable across the whole radius of the wafer.

The surface of the wafer may be dried by spinning the wafer using the rotatable chuck and heating the wafer to cause evaporation of the liquid.

The apparatus of the present invention may therefore be a spin-clean apparatus for spin cleaning a wafer.

The controller may be configured to determine the temperature, or information relating to the temperature, at one or more locations on the surface of the wafer based on the measurement output of the image sensor, and control supply of power to the array of heating elements based on the determined temperature or information relating to the temperature.

The power supplied to the array of heating elements may be controlled to change the temperature at the one of more locations on the surface of the temperature.

For example, the temperature, or information relating to the temperature, may be compared to a reference, which may relate to a previous measurement or prediction for a wafer having the desired temperature distribution or a target value, any discrepancy may be identified, and the power supplied to the array of heating elements may be controlled to reduce or to remove any identified discrepancy. In this manner, the temperature distribution of the wafer may be controlled in real-time to equal or approximate to the desired temperature distribution.

The controller may be configured to determine a temperature distribution across some of all of the surface of the wafer, or information relating to such a temperature distribution, based on the measurement output of the image sensor, and control supply of power to the array of heating elements based on the determined temperature distribution or information relating to the temperature distribution.

Each of the heating elements of the array of heating elements may be individually controllable, and the controller may be configured to individually control power supplied to each of the heating elements. This may enable more precise control of the temperature distribution across the wafer.

Alternatively, the array of heating elements may comprise a plurality of individually controllable groups of heating elements, and the controller may be configured to individually control power supplied to each of the plurality of groups of heating elements.

In this manner, each of the groups of heating elements may be individually activated by the controller by supplying power to that group. This may reduce a complexity of the apparatus relative to controlling each of the heating elements individually.

Each group of heating elements may be arranged to heat a different zone of the wafer when the wafer is received by the rotatable chuck.

The plurality of groups of heating elements may be arranged concentrically about the axis of rotation of the rotatable chuck, such that each group occupies a respective radial position. In this manner, different radial zones of the wafer may be heated by activating different groups of heating elements.

The apparatus may comprise a filter adapted to selectively transmit electromagnetic radiation having a predetermined wavelength or range of wavelengths.

This may aid detection of electromagnetic radiation having the predetermined wavelength by the image sensor, because other wavelengths of electromagnetic radiation, which for example may be caused by environmental noise, may be blocked by the filter.

"Selectively transmit" may mean that the filter transmits only the predetermined wavelength, and/or wavelengths not less than a predetermined percentage or predetermined amount less than the predetermined wavelength, and/or wavelengths not more than a predetermined percentage or predetermined amount more than the predetermined wavelength.

The filter may be a low-pass filter, or a high-pass filter, or a band-pass filter, for example.

The predetermined wavelength may be chosen based on a thermal emission spectrum of a liquid used in the processing of the wafer.

The filter may be adapted to selectively transmit thermal radiation emitted by a liquid used in processing the wafer.

The filter may be adapted to selectively transmit thermal radiation emitted by isopropyl alcohol.

For example, the filter may be adapted to selectively transmit thermal radiation having a characteristic wavelength emitted by isopropyl alcohol (IPA), for example a wavelength of a peak in the emission intensity spectrum of isopropyl alcohol (IPA).

The filter may be adapted to selectively transmit electromagnetic radiation that has a wavelength in the range of 3.3 to 3.5 µm or the range of 8.6 to 9.1 µm. Such wavelengths may be characteristic wavelengths emitted by isopropyl alcohol (IPA).

The filter may be adapted to selectively transmit electromagnetic radiation having a wavelength in a range where the transmissivity of isopropyl alcohol (IPA) is below 80%. Where IPA is present on the surface of the wafer, this provides an advantage that some, a majority, or all electromagnetic radiation coming from below the IPA may be shielded by the IPA and therefore not detected by the image sensor.

The filter may be configured to selectively transmit electromagnetic radiation having a wavelength corresponding to a peak in an emission intensity spectrum of isopropyl alcohol (IPA).

The filter may be configured to selectively transmit electromagnetic radiation having a wavelength corresponding to a minimum (local or absolute minimum) of a transmission spectrum for isopropyl alcohol (IPA).

In a spin cleaning apparatus, when the rotatable chuck is rotated, the spinning of the wafer causes liquid on the surface of the wafer to move radially outwards across the surface of the wafer. A drying line that is a transition between a dry area and a wet area on the surface of the wafer is therefore formed that moves radially outwards across the surface of the wafer.

Where the liquid is continually dispensed onto the surface of the wafer by a liquid dispenser, the position of the drying line will be related to the position of the liquid dispenser. For example, where a dispensing nozzle of the liquid dispenser is held at a fixed position, the position of the drying line will also be substantially fixed, and in practice will be somewhat radially inward of the position of the liquid dispenser. When the dispensing nozzle is moved, the position of the drying line will move in conjunction with the movement of the position of the dispensing nozzle.

When performing spin cleaning of a wafer, the dispensing nozzle may be moved so as to move radially outwards over the surface of the wafer. In this case, the drying line may also move radially outwards over the surface of the wafer, tracking the movement of the dispensing nozzle.

As discussed in US2017/0345681A1, it is advantageous to preferentially heat the wafer adjacent to the drying line (on the dry side of the drying line) to a temperature higher than elsewhere on the surface of the wafer. This can generate more rapid drying of the liquid at the drying line, which can prevent a phenomenon of pattern collapse during drying that can otherwise occur.

In embodiments of the present invention, the controller may be configured to analyse the measurement output of the image sensor, or information derived from that measurement output, to determine a position of a drying line on the surface of the wafer, the drying line corresponding to a transition between a dry area and a wet area on the surface of the wafer, and control supply of power to the array of heating elements based on the determined position of the drying line.

The drying line may be substantially in the shape of a circle centred on the axis of rotation of the wafer.

As mentioned above, a radial position of the drying line may be the same as, or correspond to, or be related to, a radial position at which liquid is being dispensed on to the surface of the wafer. Therefore, if the position at which liquid is being dispensed on to the surface of the wafer is moved radially outwards across the surface of the wafer, the drying line may also similarly move radially outwards across the surface of the wafer.

The controller may be configured to determine the position of the drying line using an edge detection algorithm. Many suitable edge detection algorithms are known that can be used.

The controller may be configured to control supply of power to the array of heating elements so that the wafer is heated to a higher temperature adjacent to the drying line than elsewhere on the wafer. As mentioned above, this may help prevent a phenomenon of pattern collapse during drying of the wafer when spin cleaning the wafer.

The controller may be configured to control supply of power to the array of heating elements so that the wafer is heated to a higher temperature adjacent to the drying line on the dry side of the drying line than elsewhere on the wafer. As mentioned above, this may help prevent a phenomenon of pattern collapse during drying of the wafer.

The controller may be configured to control the heating elements to cause heating of the surface of the wafer along a radially moving circumferential front.

The radially moving circumferential front may maintain a fixed orientation relative to the drying line. For example, the radially moving circumferential front may maintain a fixed radial distance from the drying front, and for example may be immediately adjacent to the drying front on the dry side of the drying front. The radially moving circumferential front may track radial movement of the dispensing nozzle that is dispensing liquid onto the surface of the wafer.

The controller may additionally control the array of heating elements to heat some or all of other parts of the wafer to a lower temperature.

The array of heating elements may be arranged to heat a surface of the wafer that is on an opposite side of the wafer compared to the surface of the wafer that is imaged by the camera.

The apparatus may further comprise a plate arranged to be between the array of heating elements and the wafer when the wafer is received in the rotatable chuck. The plate may serve to protect the array of heating elements from processes that are being performed on a surface of the wafer.

The plate may be transparent, and for example may be made of quartz or sapphire.

Where the heating elements are light-emitting heating elements, the transparent plate may be transparent to light emitted by the light-emitting heating elements.

The wafer may be a semiconductor wafer.

According to a second aspect of the invention, there is provided a method of controlling the apparatus according to the first aspect of the invention. The method of the second aspect of the invention may include features discussed above in relation to the first aspect of the invention; these features are therefore not repeated.

The method may comprise: dispensing liquid onto a surface of a wafer received by the rotatable chuck; rotating the rotatable chuck to remove the liquid from the surface of the wafer; during the rotating, supplying power to the array of heating elements to heat the surface of the wafer; detecting, with the image sensor, electromagnetic radiation from the surface of the wafer; and based on the measurement output of the image sensor, adjusting the power supplied to the array of heating elements.

BRIEF DESCRIPTION OF THE DRAWINGS

Embodiments of the invention are discussed below with reference to the accompanying drawings, in which:

FIG. 4b is a plot of the differential of the temperature with respect to radial distance versus radial distance of the example plot in FIG. 4a.

DETAILED DESCRIPTION; FURTHER OPTIONS AND PREFERENCES

Figure 1:
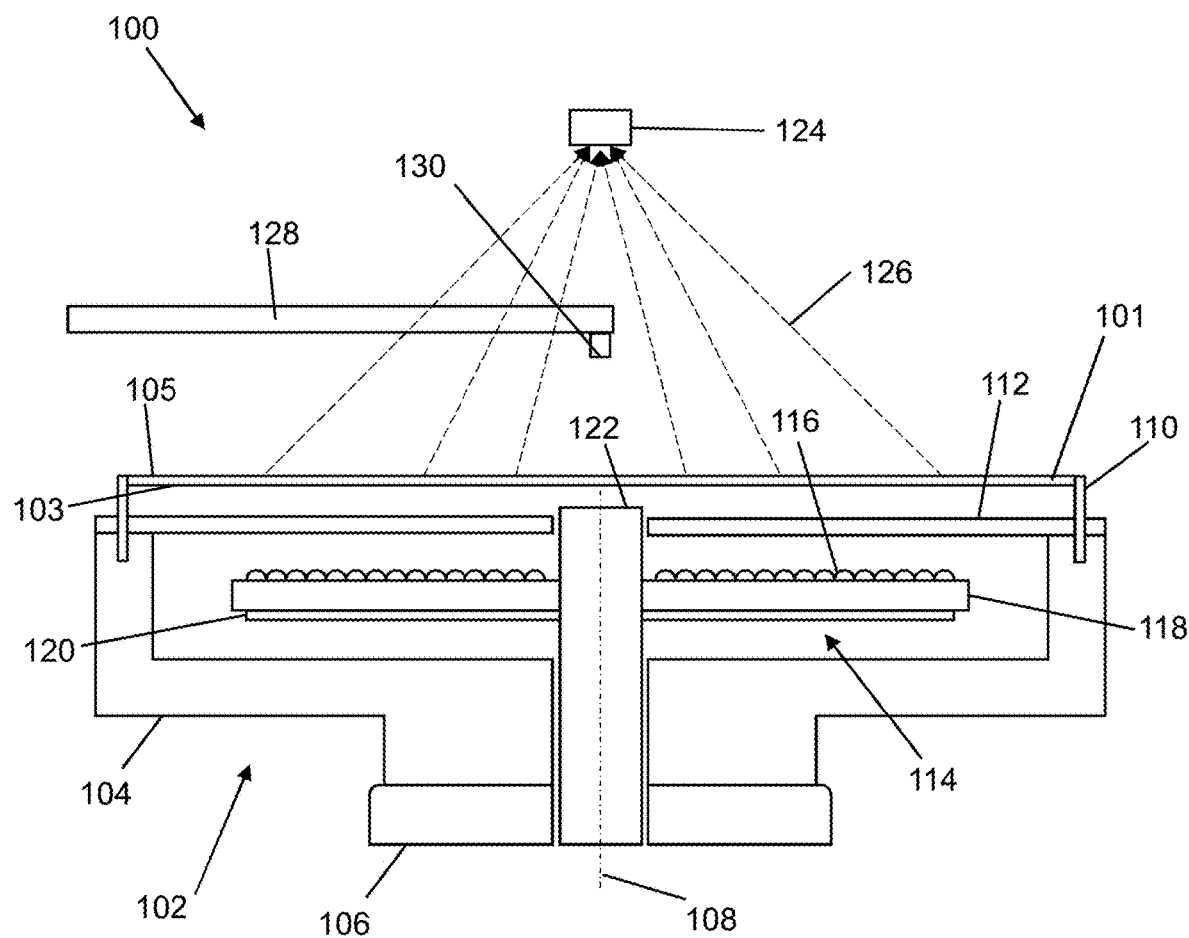
FIG. 1 is a schematic cross-sectional view of an apparatus according to an embodiment of the invention.

FIG. 1 shows a schematic cross-sectional diagram of an apparatus 100 for processing a wafer according to a first embodiment of the invention. In FIG. 1 a wafer 101 is mounted in the apparatus 100.

The apparatus 100 includes a rotatable chuck 102 which is adapted to receive a wafer. The rotatable chuck 102 includes a chuck body 104 which is rotatably mounted on a base 106. The chuck body 104 is rotatable relative to the base 106 about an axis of rotation indicated by reference numeral 108. Rotation of the chuck body 104 relative to the base 106 may be driven, for example, by a motor (not shown), which may itself be controlled by a controller. The chuck body 104 includes a set of gripping pins 110 which are adapted to receive the wafer 101 and hold the wafer 101 securely in place. In this manner, when the wafer 101 is mounted on the rotatable chuck 102 via the gripping pins 110, the wafer 101 may be rotated by rotating the chuck body 104 relative to the base 106.

In the configuration shown in FIG. 1, the gripping pins 110 exert a gripping force to hold the wafer 101 in place. However, other suitable mechanisms may be used for holding the wafer 101 in place instead (e.g. clamp, screws, suction holder, etc.).

The rotatable chuck 102 further includes a plate 112 mounted on the chuck body 104. The plate 112 is secured to the chuck body 104, such that it rotates with the chuck body 104 relative to the base 106. As shown in FIG. 1, the plate 112 is arranged such that it is substantially parallel to the wafer 101 when the wafer 101 is mounted in the rotatable chuck 102. In this embodiment the plate 112 is a transparent plate, for example made of quartz or sapphire.

The apparatus 100 further comprises a heating assembly 114. In this embodiment, the heating assembly 114 comprises an array of LEDs 116 arranged to illuminate a wafer mounted in the rotatable chuck 102. The LEDs 114 serve as light-emitting heating elements for heating the wafer 101 received by the rotatable chuck 102.

In this embodiment, the LEDs 116 are arranged to emit light in a wavelength range from 380 nm to 650 nm. For example, the LEDs 116 may emit light having a maximum intensity in the wavelength range from 380 nm to 650 nm. Such a wavelength range is suitable for heating a semiconductor wafer.

The transparent plate 112 is configured such that it is substantially transparent to wavelengths emitted by the LEDs 116, i.e. all or a majority of light emitted by the LEDs 116 is transmitted by the transparent plate 112.

The heating assembly 114 further comprises a plate 118. The array of LEDs 116 is mounted on an upper surface of the plate 118, which acts as a heat-sink for the array of LEDs 116 to dissipate heat generated by the LEDs 116. For example, the plate 118 may be made of a metal such as aluminium. A circuit board 120 including driving circuitry (not shown) for the LEDs 116 is provided on a lower surface of the plate 118. Interconnections between the array of LEDs 116 and the driving circuitry on the circuit board are made through the plate 118. The plate 118 is mounted on a stationary post 122. The stationary post 122 is not connected to the chuck body 104 such that it does not rotate with the chuck body 104. The plate 118 is substantially parallel to the transparent plate 112.

The array of LEDs 116 is arranged to face towards the wafer 101 when the wafer is mounted in the rotatable chuck 102. As shown in FIG. 1, when the wafer 101 is mounted in the rotatable chuck 102, the transparent plate 112 is located between the array of LEDs 116 and the wafer 101. Thus, light emitted by the array of LEDs 116 may be transmitted by the transparent plate 112 and impinge on the wafer 101 to heat the wafer 101. The transparent plate 112 may serve to protect the array of LEDs 116 from processes that are performed on the wafer 101 when the wafer is mounted in the rotatable chuck 102.

The array of LEDs 116 is arranged to illuminate a first surface 103 of the wafer 101, which is opposite a second surface 105 of the wafer 101. The second surface 105 of the wafer 101 is exposed, such that processes (e.g. etching, depositing of material, cleaning) may be performed on the second surface 105 of the wafer 101.

The array of LEDs 116 may be disposed substantially symmetrically about the axis of rotation 108 of the rotatable chuck 102. In this manner, the array of LEDs 116 may illuminate the wafer substantially symmetrically about the axis of rotation 108.

The apparatus 100 further comprises a liquid dispenser for dispensing a liquid on to the second surface 105 of the wafer 101, for example for cleaning the second surface 105. In this embodiment, the liquid dispenser includes an arm 128 having a discharge nozzle 130. The arm 128 is supplied with process and/or rinse liquid that is discharged downwardly through the discharge nozzle 130 onto the second surface 105 of the wafer 101.

The arm 128 is a swing arm 128 that is pivotally mounted at an end of the arm 128 opposite to an end of the arm 128 at which the discharge nozzle 130 is located, so that the arm 128 can be rotated about the pivotal mounting to change a position of the discharge nozzle 130 relative to the second surface 105 of the wafer 101. In particular, by rotating the arm 128 about the pivotal mounting 128, a radial position of the discharge nozzle 130 relative to the second surface 105 of the wafer 101 can be changed, for example between a first position located at a centre of the second surface 105 of the wafer 101 and a second position located radially outside an outer circumferential edge of the wafer 101. The discharge nozzle 130 is moved in an arc over the second surface 105 of the wafer 101.

The configuration of the liquid dispenser described above, together with the rotation of the wafer 101 by the rotatable chuck 102, means that the liquid dispenser can be operated to dispense liquid over the entire second surface 105 of the wafer 101, by pivoting the arm 128 from the centre of the second surface 105 to the edge of the second surface 105 while the wafer 101 is rotated.

Of course, in other embodiments other suitable liquid dispensers may be used instead of this specific liquid dispenser.

Figure 2A:
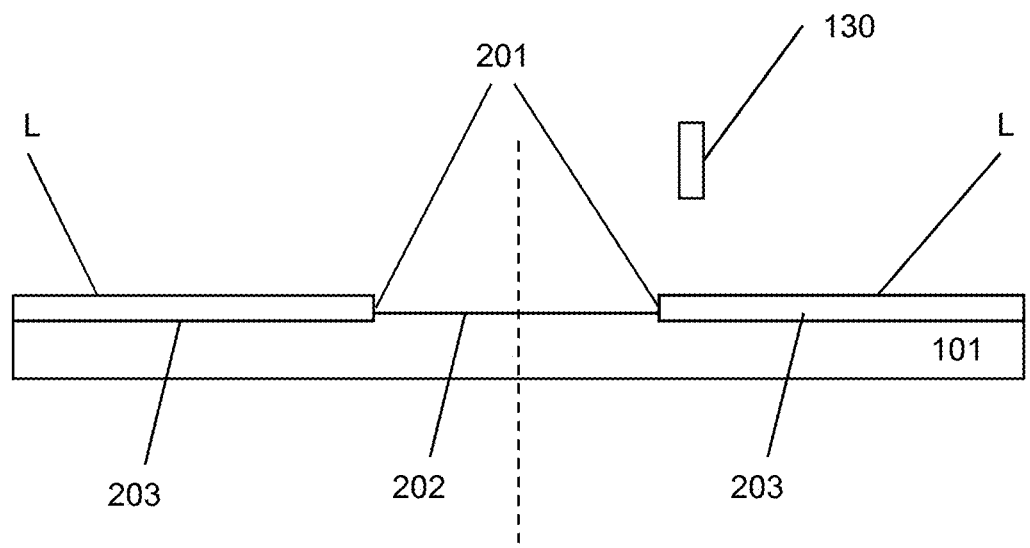
FIG. 2a is a schematic illustration of the formation of a drying line on a surface of the wafer in an embodiment of the invention.

As shown in FIG. 2a, as the discharge nozzle 130 of the arm 128 is moved from the centre of the second surface 105 of the wafer 101 to the edge of the second surface 105 while dispensing a liquid L and while the wafer 101 is rotated, a drying line 201 that is a transition between a dry area 202 of the wafer and a wet area 203 of the wafer is generated that moves radially outwards across the second surface 105 of the wafer 101 in correlation with the movement of the discharge nozzle 130. For example, the drying line may be substantially in the shape of a circle centred on the axis of rotation of the wafer 101. The radial position of the drying line 201 at any given time may correspond to the radial position of the discharge nozzle 130. In practice, the drying line is likely to be somewhat radially inward of the radial position of the discharge nozzle 130.

As discussed in US2017/0345681, when spin cleaning the surface of a wafer having high aspect ratio surface features, for example fins of doped silicon, drying of the liquid used in the spin cleaning may cause a phenomenon of pattern collapse in which the high aspect ratio surface features are damaged.

For example, the surface tension of the cleaning liquid or rinse liquid (e.g. isopropyl alcohol (IPA)) and the high aspect ratio of the structures formed on the surface of the wafer may mean that the cleaning liquid or rinse liquid drives off more slowly from the spaces between the high aspect ratio structures, which can lead to a meniscus being formed in the spaces between the structures. As the drying continues, the surface tension of the cleaning liquid or rinse liquid can pull the structures towards each other, changing their shape and/or damaging or destroying them, which can impair or prevent the correct performance of the associated semiconductor device.

US2017/0345681 describes that the phenomenon of pattern collapse can be reduced or prevented by preferentially heating the surface of the wafer to a higher temperature adjacent to the drying line. This localised higher temperature heating can serve to evaporate the cleaning liquid or rinse liquid sufficiently quickly at the drying line that a meniscus is not formed between the high aspect ratio structures, such that the phenomenon of pattern collapse is thereby avoided. As the drying line moves radially outwards over the surface of the wafer tracking the radial movement of the dispensing nozzle, the localised higher temperature heating is also moved radially outwards over the surface of the wafer to track the movement of the drying line. A front of localised higher temperature that moves radially outward across the surface of the wafer tracking the movement of the dispensing nozzle is therefore generated.

This type of heating is employed in some embodiments of the invention.

Figure 2B:
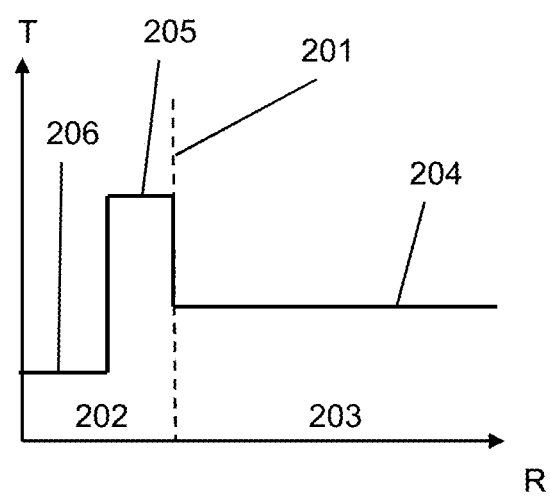
FIG. 2b is a schematic illustration of a heating temperature profile applied in the arrangement illustrated in FIG. 2a in an embodiment of the invention.

FIG. 2b shows an example of a heating profile that can be applied to the arrangement illustrated in FIG. 2a in an embodiment of the invention.

FIG. 2b shows the temperature T to which the wafer 101 is heated by the heating assembly 114 against the radial position R on the wafer 101. The radial position R is a distance along a radial direction of the wafer 101 from the axis of rotation of the wafer 101.

The radial position of the drying line 201 is shown using a broken line in FIG. 2b.

FIG. 2b shows the temperature profile along a single radial direction. In practice the temperature profile may be the same or substantially the same along all radial directions (i.e. the temperature profile of the wafer may be rotationally symmetric or substantially rotationally symmetric). However, the temperature profile may be different in different radial directions, due to environmental factors etc.

As shown in FIG. 2b, in the wet area 203 the liquid on the wafer 101 is heated to a temperature 204 that is elevated but that does not cause premature drying of the liquid.

In contrast, in the dry area 202 adjacent to the drying line 201 the temperature of the wafer 101 is elevated substantially to a temperature 205 so as to cause the evaporation rate of the cleaning liquid or rinsing liquid to be sufficiently high that no meniscus (or a flat or 90 degree meniscus) is formed between high aspect ratio features, so as to avoid the pattern collapse phenomenon discussed above.

As shown in FIG. 2b, in the remainder of the dry area 202 the already dried wafer is maintained at a lower but still elevated temperature 206, to ensure complete evaporation of the rinse liquid and to prevent condensation on the dried wafer surface.

Therefore, in the invention a front of localised higher temperature that moves radially outward across the surface of the wafer may be generated.

The front of localised higher temperature may have substantially a ring shape over the second surface 105 of the wafer 101.

A radial position of the front of localised temperature may correspond to a radial position of the drying line on the surface of the wafer.

A radial position of the front of localised temperature may correspond to a radial position of the discharge nozzle 130.

The apparatus 100 further comprises an image sensor in the form of an infrared camera 124 that is arranged to detect infrared radiation from the second surface 105 of the wafer 101.

In FIG. 1 the infrared camera 124 is shown as being positioned above the axis of rotation of the wafer 101. Such a positioning of the infrared camera 124 may mean that the infrared camera 124 can easily detect infrared radiation from the whole second surface 105 of the wafer 101. However, in other embodiments the infrared camera 124 may be provided in a different position so as to detect infrared radiation from some or all of the second surface 105 of the wafer 101.

The infrared camera 124 detects a two-dimensional infrared intensity distribution from the second surface 105 of the wafer 101.

The infrared camera 124 may be configured to detect infrared radiation having a wavelength in the range of 3 to 14 µm, or 3 to 5 µm, or 8 to 14 µm, or indeed any suitable range of wavelengths of infrared radiation.

The apparatus 100 may further include a controller (not shown) to control power supplied to the array of LEDs 116, and to receive a measurement output from the infrared camera 124.

The controller may be any suitable computing device having software installed thereon for performing the required functions. For example, the controller may be connected to the circuit board 120 via a communication interface (e.g. USB, Ethernet, etc.) to control the amount of power supplied to the array of LEDs 116. Similarly, the controller may be connected to the infrared camera 124 via a communication interface to receive measurement outputs from the infrared camera 124. The controller may include a memory in which various control parameters (e.g. power levels) for the array of LEDs 116 is stored. The controller may also store measurement data received from the infrared camera 124.

The LEDs 116 may be arranged in a plurality of individually controllable groups of LEDs 116. Power may be supplied independently to each of the plurality of groups of LEDs 116, e.g. via circuitry on the circuit board 120, such that each of the groups of LEDs 116 may be independently controlled (e.g. switched on or off). Each group of LEDs 116 may be arranged to heat a particular zone of the wafer 101, such that different zones of the wafer 101 may be controllably heated. The plurality of groups of LEDs 116 may be arranged concentrically about the axis of rotation 108 of the rotatable chuck 102, such that each group occupies a respective radial position. In this manner, different radial zones of the wafer 101 may be heated by activating different groups of LEDs 116.

The controller may be configured to automatically control the power supplied to the array of LEDs 116 based on the measurement output received from the infrared camera 124. For example, the controller may adjust the power supplied to the array of LEDs 116 until the measurement output indicates a desired temperature distribution on the second surface 105 of the wafer 101. Where the array of LEDs 116 includes a plurality of individually controllable groups of LEDs 116, the controller may automatically adjust the power supplied to each of the groups of LEDs 116 so that a desired output is obtained for each group so as to achieve the desired temperature distribution on the surface 105 of the wafer 101.

In this embodiment the controller is configured to determine a temperature distribution across some or all of the surface 105 of the wafer 101, or information relating to such a temperature distribution, based on the measurement output from the infrared camera 124. The controller is further configured to control supply of power to the array of LEDs 116 based on the determined temperature distribution or information relating to the temperature distribution.

For example, the controller may store in a memory a target temperature distribution for the second surface 105 of the wafer 101, or information relating to such a target temperature distribution. Based on the measurement output from the infrared camera 124, any divergence between the current temperature distribution and the target temperature distribution may be identified. Then, the power supplied to the LEDs 116 may be controlled to substantially remove or reduce any identified divergence, such that the current temperature distribution substantially matches or corresponds to the target temperature distribution.

Where each of the LEDs 116 is individually controllable, the controller may individually control the power supplied to each of the LEDs 116.

In contrast, where the LEDs are arranged into a plurality of individually controllable groups, the controller may individually control the power supplied to each of the plurality of groups of LEDs 116.

In an embodiment of the invention, a target temperature distribution for the second surface 105 of the wafer 101 may be similar to that illustrated in FIG. 2*b*. For example, a target temperature distribution may include a localised (in the radial direction) area of higher temperature immediately adjacent to the drying line 201, so as to heat the wafer 101 to a higher temperature adjacent to the drying line 201 so as to avoid or reduce the phenomenon of pattern collapse.

In an embodiment of the invention, the measurement output of the infrared camera 124 may be analysed to determine a position of the drying line 201 on the surface of the wafer. For example, the position of the drying line 201 may be determined by applying an edge detection algorithm to the measurement output of the infrared camera 124.

Figure 3:
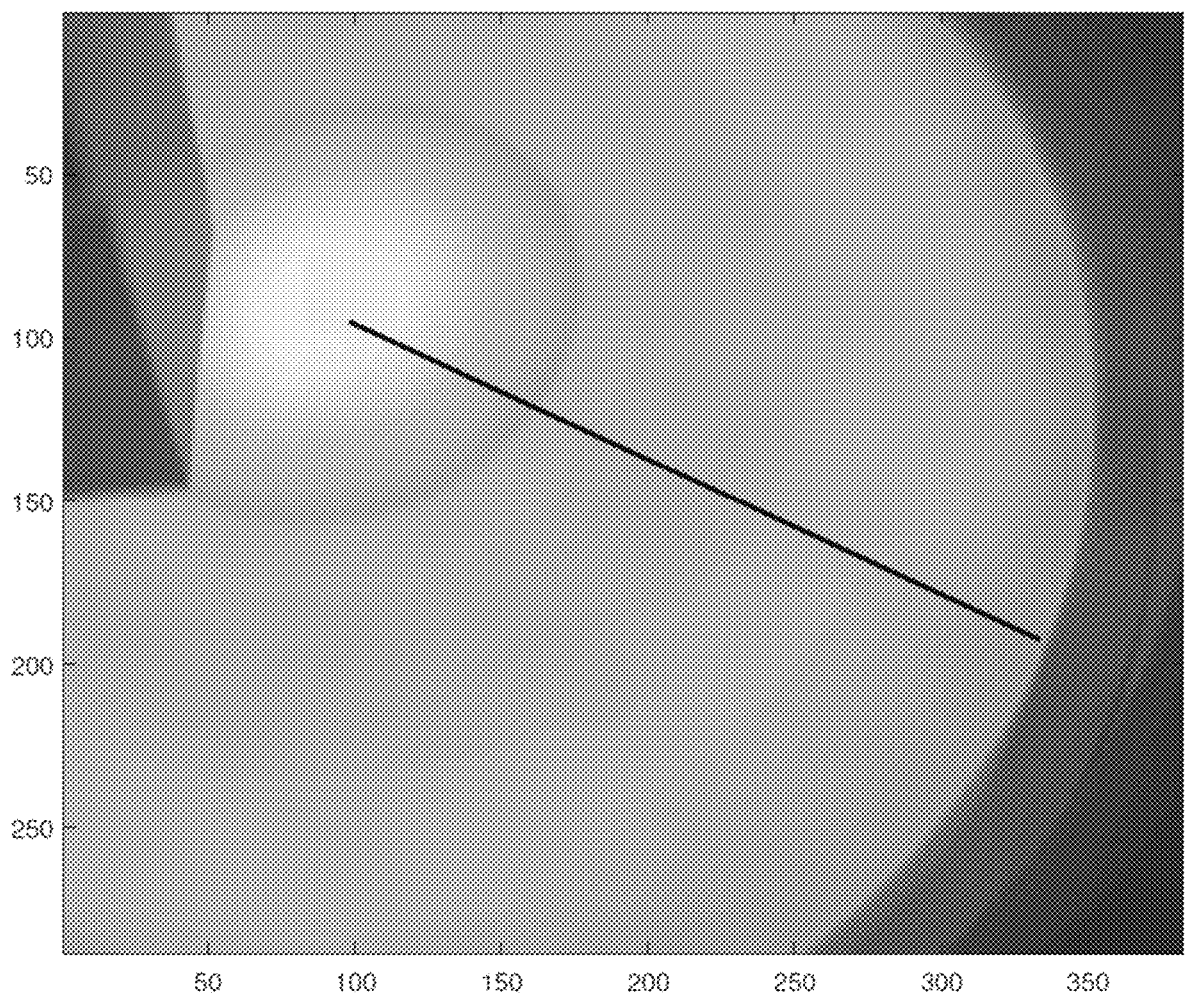
FIG. 3 is an example of an image of infrared radiation from a wafer captured by the infrared camera in an embodiment of the invention.

FIG. 3 is an example of the measurement output of the infrared camera 124 in an embodiment of the invention. The x-axis and y-axis in FIG. 3 show distance in perpendicular x- and y-directions on the surface of the wafer 101, and the shading represents different intensities of infrared radiation detected from the surface of the wafer 101 (the lighter the shading the higher the temperature).

Figure 4A:
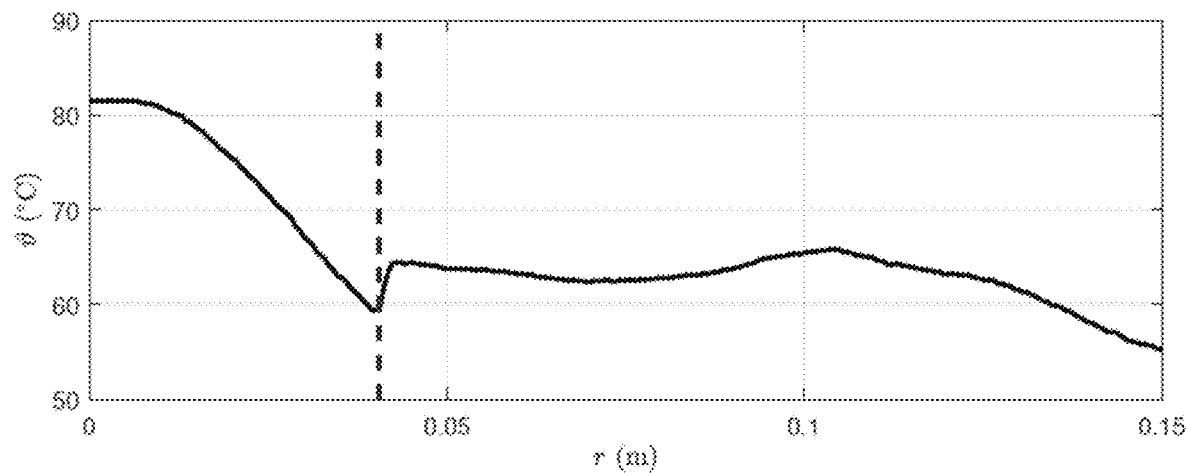
FIG. 4a is an example plot of the temperature versus radial distance obtained from the image in FIG. 3.
Figure 4B:
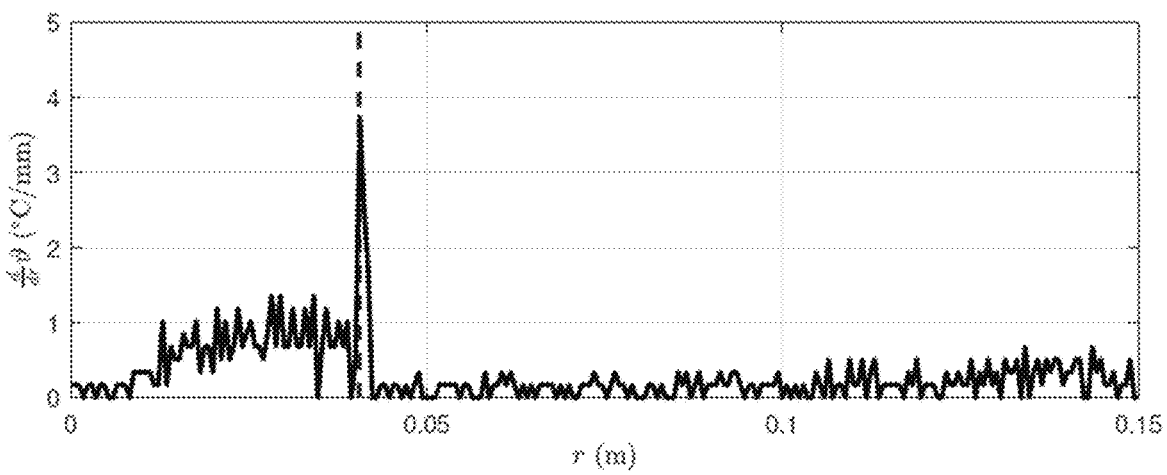

FIG. 4*a* shows the variation of temperature against distance along the solid line shown in FIG. 3. FIG. 4*b* shows the differential of the temperature with respect to the distance in FIG. 4*a*.

At the position of the drying line 201 (the broken line in FIGS. 4*a* and 4*b*) there is a sudden change in the temperature of the second surface 105 of the wafer 101, due to the transition between the dry area of the surface and the wet area of the surface.

Therefore, as shown in FIG. 4*b*, the position of the drying line can be determined by determining the position of the maximum value of the differential of the temperature with respect to the radial distance.

Of course, in other embodiments different techniques can be used for identifying the position of the drying line.

The supply of power to the array of LEDs 116 may then be controlled based on the determined position of the drying line 201. For example, as discussed above, the supply of power to the array of LEDs 116 may be controlled to generate a localised higher temperature region immediately adjacent to the determined position of the drying line 201 (on the dry side of the drying line).

As the drying line 201 moves radially outwards across the surface 105 of the wafer 101, for example tracking the radial movement of the dispensing nozzle, the supply of power to the array of LEDs 116 may also be controlled to cause the localised higher temperature region to move radially outwards across the surface 105 of the wafer 101 in correspondence with the movement of the drying line 102.

In this manner a radially moving circumferential front of higher temperatures may be generated by the LEDs 116.

In embodiments of the present invention the liquid dispensed on the second surface 105 of the wafer 101 is isopropyl alcohol (IPA), which may be used to clean or rinse the second surface 105 of the wafer 101.

Infrared radiation emitted by objects other than the surface of the wafer 101 may also be detectable by the infrared camera 124, which may interfere with the detection of the infrared radiation from the surface of the wafer 101. For example, infrared radiation may also be emitted by other parts of the apparatus 100, or by other objects in the environment around the apparatus 100.

In order to more easily and/or accurately detect the infrared radiation from the surface 105 of the wafer 101, the apparatus 100 may include a filter (not illustrated) adapted to selectively transmit infrared radiation having a predetermined range of wavelengths. The filter is attached to, or provided adjacent to, an aperture of the infrared camera 124, so that all or most infrared radiation entering the aperture of the infrared camera 124 passes through the filter first.

Preferably the filter is a band-pass filter, which only transmits a predetermined range of wavelengths of infrared radiation. However, the filter may alternatively be a low-pass filter or a high-pass filter.

In practice, the wavelengths that the filter transmits will be selected based on a thermal emission spectrum of the liquid dispensed on the wafer. In particular, the filter will be adapted to selectively transmit thermal radiation emitted by the liquid dispensed on the wafer.

Therefore, where the liquid dispensed on the surface 105 of the wafer 101 is isopropyl alcohol (IPA), the filter will be adapted to selectively transmit thermal radiation emitted by isopropyl alcohol.

For example, the filter may be adapted to selectively transmit thermal radiation having a characteristic wavelength emitted by isopropyl alcohol (IPA), for example a wavelength of a peak in the emission intensity spectrum of isopropyl alcohol (IPA).

The filter may be adapted to selectively transmit electromagnetic radiation that has a wavelength in the range of 3.3 to 3.5 μm or the range of 8.6 to 9.1 μm. Such wavelengths may be characteristic wavelengths emitted by isopropyl alcohol (IPA).

In practice the semiconductor wafer is usually a semiconductor wafer.

Figure 5:
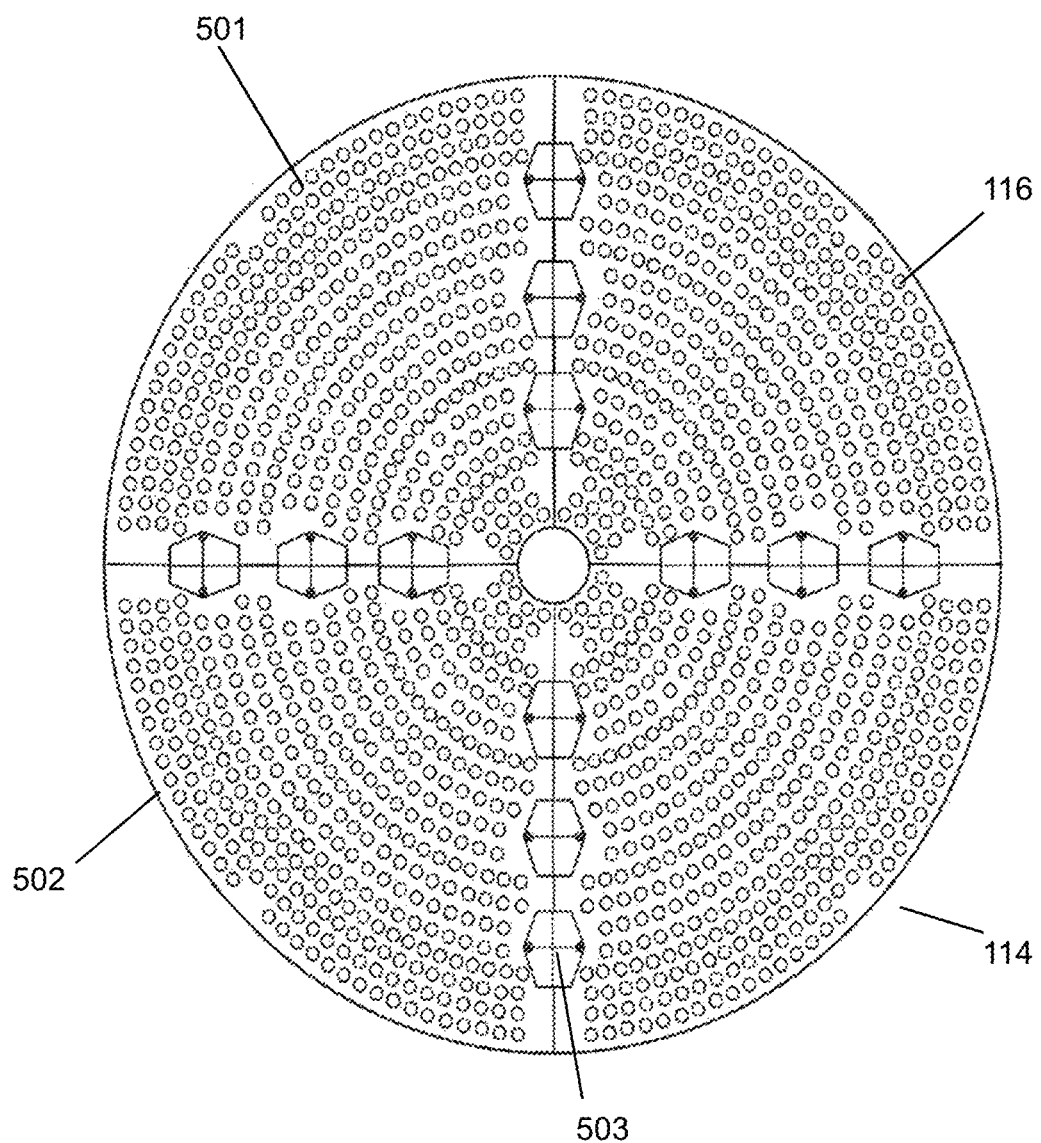
FIG. 5 is an example of a heating assembly that can be used in embodiments of the present invention.

An example configuration of the heating assembly 114 in some embodiments of the present invention is illustrated in FIG. 5.

As shown in FIG. 5, the LEDs 116 are arranged on concentric rings around a centre of the heating assembly 114. The arrangement of the LEDs 116 is rotationally symmetric around the centre of the heating assembly 114.

Within a given concentric ring, the LEDs 116 are bunched into groups 501, for example with 16 LEDs 116 in each group 501. In other words, the LEDs 116 in a given concentric ring are not evenly distributed around the concentric ring.

As discussed above, the power to each of the groups 501 of LEDs 116 may be independently controlled.

In this example there are 20 concentric rings of LEDs 116, but of course in other embodiments the number of concentric rings may be different.

In FIG. 5, the heating assembly 114 is divided into four quadrants 502, which are joined together by connectors 503.

Each LED may have a power consumption of 10 W and provide a power of 3 W.

Of course, the heating assembly 114 may be different to that illustrated in FIG. 5. In particular, the arrangement of the LEDs in the heating assembly is not essential to the present invention.

The invention claimed is:

1. An apparatus for processing a wafer, the apparatus comprising:
   a rotatable chuck adapted to receive the wafer;
   a heating assembly comprising an array of heating elements arranged to heat the wafer received by the rotatable chuck;
   an image sensor arranged to detect electromagnetic radiation from a liquid on a surface of the wafer; and
   a controller configured to
      based on an output of the image sensor, determine a position of a drying line on the surface of the wafer, wherein the output is indicative of the detected electromagnetic radiation from the liquid, wherein the drying line corresponds to a transition between a dry area and a wet area on the surface of the wafer, and wherein determining the position comprises
         analyzing the output of the image sensor and generating a temperature distribution including temperatures relative to radial locations on the wafer,
         determining a plurality of differential values, each of which is indicative of a respective difference between two of the temperatures at adjacent ones of the radial locations, and
         determining at which one of the radial locations there is a maximum differential in temperature and determining the position of the drying line as the radial location with the maximum differential, the maximum differential being a maximum one of the plurality of differential values, and
      adjust supply of power to the array of heating elements based on the position of the drying line to heat the wafer to generate a front of localized temperature on the surface of the wafer.

2. The apparatus according to claim 1, wherein the image sensor is a camera.

3. The apparatus according to claim 2, wherein the camera is a thermal imaging camera.

4. The apparatus according to claim 1, wherein the image sensor is adapted to detect electromagnetic radiation having a wavelength in a range of 3 to 14 μm.

5. The apparatus according to claim 1, wherein the apparatus comprises a liquid dispenser for dispensing the liquid on to the surface of the wafer.

6. The apparatus according to claim 1, wherein the apparatus is a spin-clean apparatus.

7. The apparatus according to claim 1, wherein the controller is configured to:

determine a temperature, or information relating to the temperature, at one or more locations on the surface of the wafer based on the output of the image sensor; and adjust the supply of power to the array of heating elements based on the temperature or information relating to the temperature.

8. The apparatus according to claim 1, wherein the controller is configured to:

determine the temperature distribution across some of all of the surface of the wafer, or information relating to the temperature distribution, based on the output of the image sensor; and adjust the supply of power to the array of heating elements based on the determined temperature distribution or information relating to the temperature distribution.

9. The apparatus according to claim 1, wherein:

each of the heating elements of the array of heating elements is individually controllable; and the controller is configured to individually control power supplied to each of the heating elements.

10. The apparatus according to claim 1, wherein:

the array of heating elements comprises a plurality of individually controllable groups of heating elements; and the controller is configured to individually control power supplied to each of the plurality of individually controllable groups of heating elements.

11. The apparatus according to claim 1, wherein the apparatus comprises a filter adapted to selectively transmit electromagnetic radiation having a predetermined wavelength or range of wavelengths.

12. The apparatus according to claim 11, wherein the filter is a band-pass filter.

13. The apparatus according to claim 11, wherein the filter is adapted to selectively transmit thermal radiation emitted by isopropyl alcohol.

14. The apparatus according to claim 11, wherein the filter is adapted to selectively transmit electromagnetic radiation that has a wavelength in a range of 3.3 to 3.5 μm or in a range of 8.6 to 9.1 μm.

15. The apparatus according to claim 1, wherein the controller is configured to determine the position of the drying line using an edge detection algorithm.

16. The apparatus according to claim 1, wherein the controller is configured to adjust the supply of power to the array of heating elements so that the wafer is heated to a higher temperature adjacent to the drying line than elsewhere on the wafer.

17. The apparatus according to claim 1, wherein the controller is configured to control the heating elements to cause heating of the surface of the wafer along a radially moving circumferential front.

18. The apparatus according to claim 1, wherein the array of heating elements is arranged to heat a surface of the wafer that is on an opposite side of the wafer compared to the surface of the wafer that is imaged by the image sensor.

19. The apparatus according to claim 1, wherein the heating elements are light-emitting heating elements arranged to illuminate the wafer to heat the wafer.

20. The apparatus according to claim 19, wherein the light-emitting heating elements are LEDs.

21. A method for processing a wafer, the method comprising:

dispensing liquid onto a surface of the wafer received by a rotatable chuck;

rotating the rotatable chuck to remove the liquid from the surface of the wafer;

during the rotating, supplying power to an array of heating elements to heat the surface of the wafer;

detecting, with an image sensor, electromagnetic radiation from the liquid on the surface of the wafer;

based on an output of the image sensor, determining via a controller a position of a drying line on the surface of the wafer, wherein the output is indicative of the detected electromagnetic radiation from the liquid, and wherein the drying line corresponds to a transition between a dry area and a wet area on the surface of the wafer, and wherein determining the position comprises analyzing the output of the image sensor and generating a temperature distribution including temperatures relative to radial locations on the wafer, determining a plurality of differential values, each of which is indicative of a respective difference between two of the temperatures at adjacent ones of the radial locations, and determining at which one of the radial locations there is a maximum differential in temperature and determining the position of the drying line as the radial location with the maximum differential, the maximum differential being a maximum one of the plurality of differential values; and adjusting the power supplied to the array of heating elements based on the position of the drying line to heat the wafer to generate a front of localized temperature on the surface of the wafer.

* * * * *